(12) United States Patent
Niemann et al.

(10) Patent No.: US 7,330,092 B2
(45) Date of Patent: Feb. 12, 2008

(54) SUPERCONDUCTOR MAGNET COIL CONFIGURATION

(75) Inventors: Volker Niemann, Straubenhardt (DE); Gerhard Roth, Rheinstetten (DE); Klaus Schlenga, Linkenheim-Hochstetten (DE)

(73) Assignee: Bruker Biospin GmbH, Rheinstetten (DE)

( * ) Notice: Subject to any disclaimer, the term of this patent is extended or adjusted under 35 U.S.C. 154(b) by 335 days.

(21) Appl. No.: 11/214,852

(22) Filed: Aug. 31, 2005

(65) Prior Publication Data
US 2006/0055494 A1 Mar. 16, 2006

(30) Foreign Application Priority Data
Sep. 11, 2004 (DE) .................. 10 2004 043 987

(51) Int. Cl.
*H01F 1/00* (2006.01)
(52) U.S. Cl. ....................... 335/216; 335/299
(58) Field of Classification Search ............... 335/216, 335/296–299, 302–306; 174/126.1, 128.1
See application file for complete search history.

(56) References Cited

U.S. PATENT DOCUMENTS

| | | | |
|---|---|---|---|
| 4,694,269 A | | 9/1987 | Burnett |
| 4,987,398 A | * | 1/1991 | Bessho ..................... 335/299 |
| 5,293,524 A | | 3/1994 | Mookerjee |
| 6,081,179 A | * | 6/2000 | Kato ........................ 335/299 |
| 7,053,740 B1 | * | 5/2006 | Laskaris et al. ........... 335/216 |
| 2007/0200654 A1 | * | 8/2007 | Yang et al. ................ 335/216 |

FOREIGN PATENT DOCUMENTS

| | | |
|---|---|---|
| GB | 1 146 784 | 3/1969 |
| GB | 2 171 562 | 8/1986 |
| JP | 62088308 | 4/1987 |
| JP | 63095607 | 4/1988 |
| JP | 05291023 | 11/1993 |
| JP | 08 298 208 | 11/1996 |
| JP | 09 129 436 | 5/1997 |
| JP | 10041127 | 2/1998 |

* cited by examiner

*Primary Examiner*—Elvin Enad
*Assistant Examiner*—Bernard Rojas
(74) *Attorney, Agent, or Firm*—Paul Vincent

(57) ABSTRACT

A superconducting magnet coil configuration comprising at least one section of a superconducting strip conductor, which is continuously wound in a cylindrical winding chamber (1) between two end flanges (2, 3) in several solenoid-like layers is characterized in that the section comprises an axial region of reduced current density (=notch region (12)), and the winding chamber (1) in the notch region (12) contains a first separating body (4) with a truncated conical envelope (5) which axially divides the winding chamber (1) into two partial chambers (6, 7), the superconducting strip conductor being guided over the truncated conical envelope (5) of the first separating body (4) from one partial chamber (6) into the other partial chamber (7) via a single-layer transfer winding (9), and a second separating body (10) is provided which supplements the first separating body (4) in the notch region (12) in a radial outer direction to form a circular cylinder, wherein the single-layer transfer winding (9) is disposed between the separating bodies (4, 10). The inventive magnet coil configuration thereby realizes an HTS coil with a notch region for correcting inhomogeneities, wherein bending of the strip conductor through a small radius of curvature is not necessary.

12 Claims, 2 Drawing Sheets

SUPERCONDUCTOR MAGNET COIL CONFIGURATION

This application claims Paris Convention priority of DE 10 2004 043 987.7 filed Sep. 11, 2004 the complete disclosure of which is hereby incorporated by reference.

BACKGROUND OF THE INVENTION

The invention concerns a superconducting magnet coil configuration with at least one section of superconducting strip conductor, which is continuously wound in a cylindrical winding chamber between two end flanges in several solenoid-like layers.

Magnet coil configurations of this type are known in the art.

Notches are frequently used to homogenize compact high field magnets via field correction of magnet coil configurations having low-temperature superconductors (LTS). A conventional notch region is designed by initially completely winding the first notch winding on one side of the notch. The wire is then bent sharply and guided axially through the notch. The second notch winding is then wound on the other side.

Highest field strengths in magnet coil configurations are obtained by using strip conductors of high-temperature superconducting (HTS) material in the innermost magnet coil windings. Due to the high mechanical sensitivity of these strip conductors, the notches cannot be conventionally designed in this region. In particular, transfer of the strip conductor from one side of the notch to the other side using the above-described sharp bend and the associated small radius of curvature is not possible with an HTS strip conductor. The mechanical sensitivity of HTS strip conductors is particularly problematic in view of forming a notch region, since damage to the HTS conductor material would result in a costly defect in the overall magnet coil configuration. Undesired inhomogeneities in HTS coils must therefore be compensated for using separate correction coils.

It is therefore the underlying purpose of the invention to propose a magnet coil configuration using a strip conductor material which has a notch area for correcting inhomogeneities, wherein the mechanical load on the HTS strip conductor is minimized.

SUMMARY OF THE INVENTION

This object is achieved in accordance with the invention in that the section comprises an axial region of reduced current density (=notch region), and the winding chamber in the notch region contains a first separating body with a truncated conical envelope which axially divides the winding chamber into two partial chambers, wherein the superconducting strip conductor is guided from one partial chamber to the other partial chamber via a single-layer transfer winding over the truncated conical envelope of the first separating body, with a second separating body being provided to supplement the first separating body in the notch region in a radially outer direction to form a circular cylinder, wherein the single-layer transfer winding is disposed between the separating bodies.

The inventive magnet coil configuration permits transfer of a superconducting strip conductor via a truncated conical envelope from the first into the second winding chamber such that the strip conductor must not be bent through a small radius of curvature during winding, thereby avoiding unnecessary mechanical load during formation of the notch region. In this manner, a magnet coil configuration with a section of superconducting strip conductor having a notch region can be realized without separate correction coils.

In a preferred embodiment, the superconducting strip conductor is a high-temperature superconductor (=HTS) and preferably contains silver-stabilized Bi—Sr—Ca—Cu oxide or YBCO. The features of the inventive magnet coil configuration can thereby be utilized with particular advantage, since HTS conductors are extremely brittle and therefore particularly sensitive to bending through a small radius of curvature. This can be avoided using the present invention.

In a particularly advantageous manner, the conical envelope of the first separating body is spirally stepped to guide the superconducting strip conductor, thereby producing a thread-like structure in the conical envelope which is adjusted to the shape of the strip conductor. In this manner, the strip conductor is optimally protected in the region of the transfer winding and the radius of the winding is continuously reduced. The radius of curvature of the strip conductor is correspondingly minimally reduced.

In another advantageous embodiment, the surface of the second separating body facing the first separating body is spirally stepped. The second separating body can then be optimally disposed onto the first separating body and the transfer winding without producing gaps which could cause undesired motion of the strip conductor material within the HTS winding.

In one embodiment of the inventive magnet coil configuration, the slope of the winding of the superconducting strip conductor in the notch region is increased compared to the slope of the windings in the partial chambers.

In one alternative embodiment, the slope of the windings of the superconducting strip conductor in the notch region is maintained, thereby realizing a compact winding of the magnet coil configuration.

In a particularly preferred embodiment of the magnet coil configuration, the notch region is axially displaced from a symmetrical configuration in such a manner that the field effects of first order generated by the transfer winding are compensated for to obtain a field distribution with optimum symmetry.

In a further embodiment, the first separating body is designed in one piece with the winding chamber. Therefore, the first separating body need not be fixed to the winding chamber.

In a particularly preferred embodiment of the invention, winding layers are continuously wound between the end flanges radially outside and/or radially inside of the notch region. The overall magnetic field can thereby be adjusted to the desired strength. If the winding layers are continuously wound radially inside of the notch region, the first separating body cannot be produced in one piece with the winding chamber.

The superconducting strip conductor used for the windings is preferably formed from stacked conductor strips which are electrically connected in parallel, since one individual conductor strip cannot carry sufficient current for the desired applications. The current carrying capacity of the strip conductor winding is thereby increased.

The inventive magnet coil configuration is advantageously superconductingly short-circuited to permit freezing of a magnetic flux.

The inventive magnet coil configuration is preferably a high-field NMR magnet in the center of which an extremely homogeneous magnetic field is generated.

Further advantages of the invention can be extracted from the description and the drawing. The features mentioned above and below may be used either individually or collectively in arbitrary combination. The embodiments shown and described are not to be understood as exhaustive enumeration but have exemplary character for describing the invention.

DESCRIPTION OF THE PREFERRED EMBODIMENT

Figure 1:
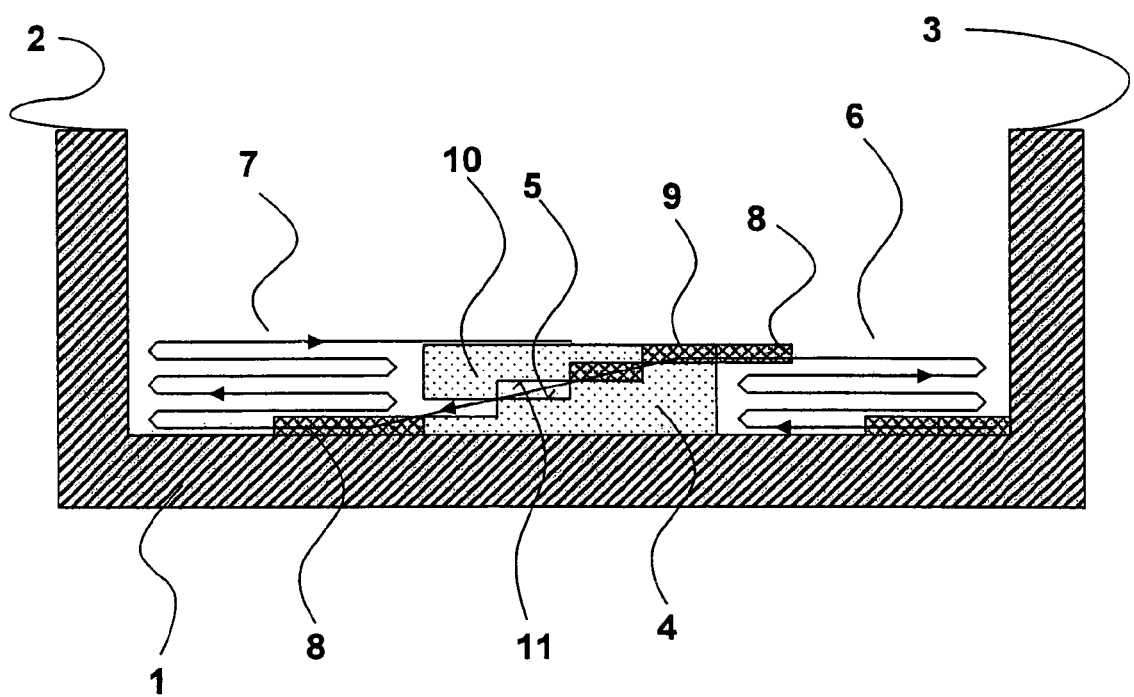
FIG. 1 shows a schematic cross-sectional view of a magnet coil configuration in accordance with the present invention.

FIG. 1 shows a magnet coil configuration with a winding chamber 1 which is limited by two end flanges 2, 3. The winding chamber 1 is divided into two partial chambers 6, 7 by a first separating body 4 having a truncated conical envelope 5. The separating body 4 forms a wall of the first partial chamber 6 and can be designed in one piece with the winding chamber 1, e.g. be milled, but may also be screwed to the winding chamber 1 or be fastened in a different manner.

An integral superconducting strip conductor is continuously wound in the winding chamber 1 in a solenoid-like fashion. Joints for the windings are therefore not required. The windings 8, 9 formed in this manner are shown only at individual selected locations in FIG. 1 for reasons of clarity. The meandering line provided with arrows indicates the further extension of the windings 8, 9 of the strip conductor which extend in a direction which is nearly perpendicular to the longitudinal axis of the strip conductor. The winding 8 initially extends in the first partial chamber 6 to the height of the first separating body 4 and then merges in the transfer winding 9 which proceeds via the truncated conical envelope 5 of the first separating body 4. The conical envelope 5 is spirally stepped to improve receipt of the strip conductor which has a generally rectangular cross-section, forming a type of thread such that the strip conductor is continuously in contact with the first separating body 4 in the region of the transfer winding 9. This prevents unnecessary load on the strip conductor by the magnetic forces exerted thereon. The steps of the conical envelope 5 are horizontal in FIG. 1 but may also be tilted with respect to the horizontal. The transfer winding 9 extends continuously from the uppermost winding layer of the first partial chamber 6 to the lowermost layer of the second winding chamber 7. From that point, the strip conductor is wound in the second partial chamber 7 like a solenoid, analogous to the first partial chamber 6. The strip conductor is thereby transferred from the first winding chamber 6 into the second partial chamber 7 without substantial mechanical load. The transfer winding 9 is surrounded by a second separating body 10 which supplements the first partial body 4 to form a hollow cylinder. To provide optimum contact between the second separating body 10 and the transfer winding 9, the surface 11 of the second separating body 10 facing the first separating body 4 can also be spirally stepped. The strip conductor is thereby in permanent contact with the separating bodies 4, 10 in the region of the transfer winding 9 and is fixed by them. The region formed by the separating bodies 4, 10 is called the notch region 12 (FIG. 2a).

The transfer winding 9 which extends over the conical envelope 5 of the first separating body 4 generates a linear axial magnetic field gradient in the magnetic center of the magnet coil configuration which is caused by the differently sized winding radii of the transfer winding 9, whereby the field strength on the side of the notch region 12 with the larger winding radii is slightly smaller than the field strength on the side of the smaller winding radii. This linear gradient can be compensated for by slightly displacing the notch region 12 in the direction of the side of the higher field strength, such that the lengths of the partial chambers 6, 7 slightly differ.

Figure 2A:
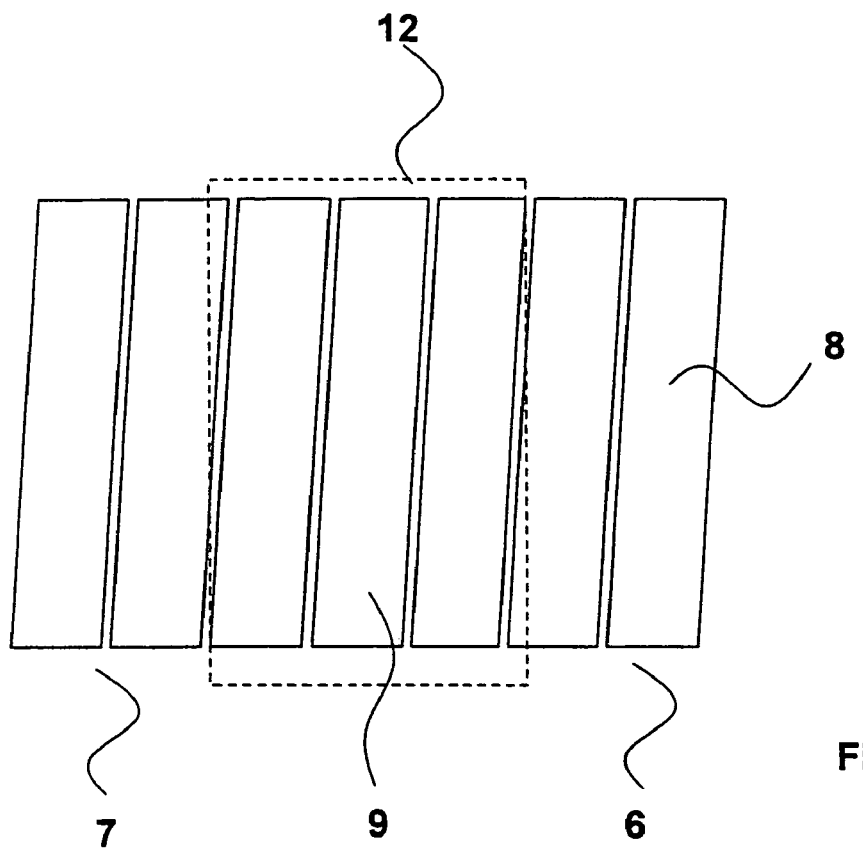
FIG. 2a shows a schematic view of the dependence of the HTS windings of a magnet coil configuration in accordance with the present invention.

FIG. 2a shows a top view of a section of a magnet coil configuration in accordance with the present invention without the second separating body 10. The region housing the first separating body 4 and, during operation, of course also the second separating body 10, defines the notch region 12 and is shown in dashed lines. FIG. 2a clearly shows that the transfer winding 9 is continuously wound over the entire notch region 12 without subjecting the strip conductor to sharp bends. The windings 8, 9 extend parallel to each other throughout the entire winding chamber 1. The windings of the transfer winding 9 are displaced in height due to the truncated conical envelope of the first separating body 4 such that the strip conductor is transferred from the uppermost winding layer of the first partial chamber 6 to the lowermost layer of the second partial chamber 7.

Figure 2B:
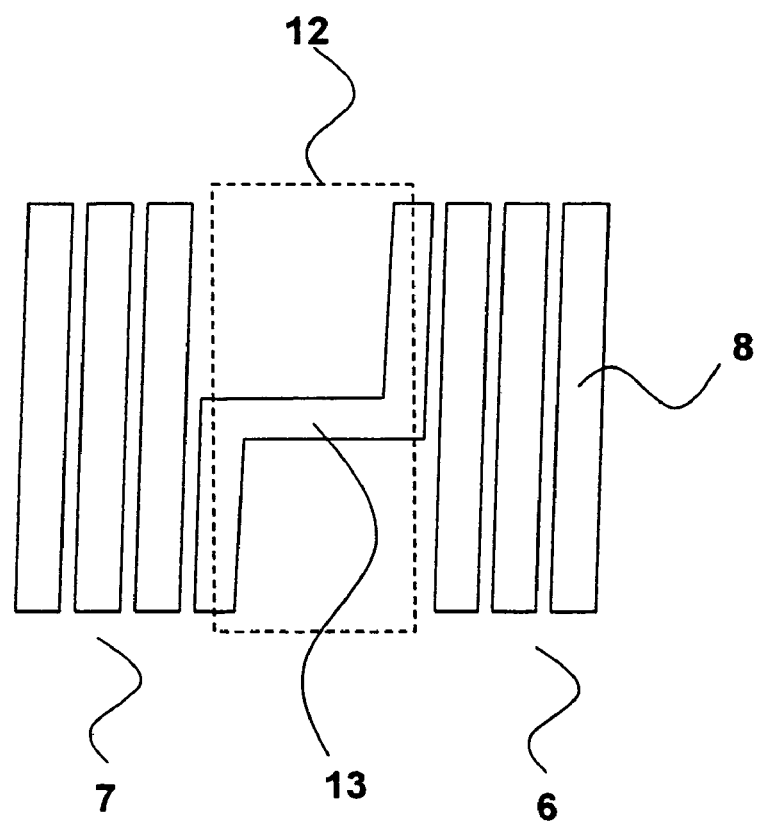
FIG. 2b shows a schematic view of the dependence of the LTS windings of a conventional magnet coil configuration.

In comparison thereto, FIG. 2b shows a top view of a section of a conventional magnet coil configuration, wherein a conductor is bent through 90° after winding of a first partial chamber 6, and is directly guided to the lowermost winding of the second partial chamber 7, where the conductor must be bent again through 90°. The conductor is thereby guided 13 within the notch region 12 substantially perpendicularly to the windings 8. This would, however, cause considerable problems with HTS conductors since they are extremely brittle, are provided in the form of strip conductors and would have to be bent through the narrow edge of the strip conductor.

The inventive winding of the strip conductor over a truncated first separating body 4 permits construction of a notch region 12 within a superconducting magnet coil configuration containing HTS materials, and therefore homogenization of a compact high-field magnet.

LIST OF REFERENCE NUMERALS 1. winding chamber
2. end flange
3. end flange
4. first separating body
5. conical envelope
6. first partial chamber
7. second partial chamber
8. windings outside of the notch region
9. transfer winding
10. second separating body
11. surface of the second separating body facing the first separating body
12. notch region
13. guidance

We claim:

1. A superconducting magnet coil configuration comprising:
   a first end flange;
   a second end flange, said first and said second end flanges limiting and defining a cylindrical winding chamber;

a first separating body disposed in a central region of said winding chamber to axially divide said winding chamber into a first and a second partial chamber, said first separating body having a truncated conical outer envelope;

a second separating body disposed radically outside of said first separating body in a complementary fashion to define, together with said first separating body, a substantially circular cylinder; and a superconducting strip conductor continuously wound in several solenoid-like layers within said winding chamber, said strip conductor passing between said first and said second separating body as a single-layer transfer winding extending from said first partial chamber into said second partial chamber, said transfer winding, said first separating body, and said second separating body constituting a notch region of reduced current density.

2. The magnet coil configuration of claim 1, wherein said superconducting strip conductor is a high-temperature superconductor, contains silver-stabilized Bi—Sr—Ca—Cu oxide, or contains YBCO.

3. The magnet coil configuration of claim 1, wherein said conical envelope of said first separating body is spirally stepped to guide said superconducting strip conductor.

4. The magnet coil configuration of claim 1, wherein a surface of said second separating body facing said first separating body is spirally stepped.

5. The magnet coil configuration of claim 1, wherein a winding slope of said superconducting strip conductor in said notch region is increased compared to said winding slope in said first and said second partial chambers.

6. The magnet coil configuration of claim 1, wherein a winding slope of said superconducting strip conductor is maintained in said notch region.

7. The magnet coil configuration of claim 1, wherein said notch region is axially displaced from a symmetrical configuration to compensate for field effects of first order generated by said transfer winding.

8. The magnet coil configuration of claim 1, wherein said first separating body is integral with an inner floor of said winding chamber.

9. The magnet coil configuration of claim 1, wherein winding layers are continuously wound between said end flanges radially outside and/or radially inside said notch region.

10. The magnet coil configuration of claim 1, wherein said superconducting strip conductor is formed from stacked conductor strips which are electrically connected in parallel.

11. The magnet coil configuration of claim 1, wherein the magnet coil configuration is superconductingly short-circuited.

12. The magnet coil configuration of claim 1, wherein the magnet coil configuration is a high-field NMR magnet in a center of which an extremely homogeneous magnetic field is generated.

* * * * *